(12) United States Patent
Gutsol et al.

(10) Patent No.: US 11,875,975 B2
(45) Date of Patent: Jan. 16, 2024

(54) METHOD AND DEVICE FOR HYDROGEN SULFIDE DISSOCIATION IN ELECTRIC ARC

(71) Applicant: Redshift Energy, Inc., Midlothian, TX (US)

(72) Inventors: Alexander Gutsol, Flourtown, PA (US); Yuriy Mirochnik, Philadelphia, PA (US)

(73) Assignee: REDSHIFT ENERGY, INC., Midlothian, TX (US)

( * ) Notice: Subject to any disclaimer, the term of this patent is extended or adjusted under 35 U.S.C. 154(b) by 357 days.

(21) Appl. No.: 17/015,505

(22) Filed: Sep. 9, 2020

(65) Prior Publication Data
US 2021/0074512 A1 Mar. 11, 2021

Related U.S. Application Data

(60) Provisional application No. 62/898,544, filed on Sep. 11, 2019.

(51) Int. Cl.
*H01J 37/32* (2006.01)
*B01J 19/08* (2006.01)
(Continued)

(52) U.S. Cl.
CPC ......... *H01J 37/3255* (2013.01); *B01J 19/088* (2013.01); *C01B 3/04* (2013.01); *C01B 17/0495* (2013.01); *H01J 37/3244* (2013.01); *H01J 37/32055* (2013.01); *B01J 2219/0809* (2013.01); *B01J 2219/0841* (2013.01);
(Continued)

(58) Field of Classification Search
CPC ............. H01J 37/3255; H01J 37/32055; H01J 37/3244; H01J 2237/338; B01J 19/088; B01J 2219/0809; B01J 2219/0841; B01J 2219/0869; B01J 2219/0875;
(Continued)

(56) References Cited

U.S. PATENT DOCUMENTS

| 2004/0188019 A1* | 9/2004 | Lopes Cardozo | ....... H05H 1/48 156/345.43 |
| 2010/0300872 A1* | 12/2010 | Gutsol | ................ C01B 17/0495 423/561.1 |

(Continued)

*Primary Examiner* — Xiuyu Tai
(74) *Attorney, Agent, or Firm* — Bardmesser Law Group

(57) ABSTRACT

Device for hydrogen sulfide plasma dissociation includes a plasma chemical reactor including an arc plasma generator that has a cathode and an anode; the anode having a working surface for contacting hydrogen sulfide plasma, wherein the working surface is made from a material that includes stainless steel, tungsten or molybdenum; the cathode having a tip for arc attachment where a cathode spot is formed, wherein the cathode tip is made from pure tungsten, pure molybdenum, a tungsten or molybdenum alloy with tungsten as a major component or a composite material in which tungsten or molybdenum is the major component; and a flow path configured to have an inlet for gaseous hydrogen sulfide for dissociation in plasma into hydrogen and sulfur, and an outlet for gaseous products of hydrogen sulfide plasma dissociation. Optionally, the alloy or composite material has up to 10% low work function elements (thorium, cerium, lanthanum, or zirconium).

11 Claims, 5 Drawing Sheets

(51) Int. Cl.
  *C01B 3/04* (2006.01)
  *C01B 17/04* (2006.01)
(52) U.S. Cl.
  CPC ............... *B01J 2219/0869* (2013.01); *B01J 2219/0875* (2013.01); *B01J 2219/0896* (2013.01); *H01J 2237/338* (2013.01)
(58) Field of Classification Search
  CPC ............... B01J 2219/0896; C01B 3/04; C01B 17/0495; Y02E 60/36
  See application file for complete search history.

(56) References Cited

U.S. PATENT DOCUMENTS

2016/0358751 A1* 12/2016 Lee .................. C23C 16/45544
2019/0247822 A1* 8/2019 Nagai .................. B22F 9/14

* cited by examiner

METHOD AND DEVICE FOR HYDROGEN SULFIDE DISSOCIATION IN ELECTRIC ARC

CROSS REFERENCE TO RELATED APPLICATIONS

This application is a non-provisional of U.S. Provisional Patent Application No. 62/898,544, filed on Sep. 11, 2019.

FIELD OF THE INVENTION

The field of the invention pertains to the plasma devices for dissociation of hydrogen sulfide.

BACKGROUND OF THE RELATED ART

Introduction and Motivation

Hydrogen sulfide ($H_2S$) is a byproduct of oil refinement and also comprises a significant portion of natural, associated, and bio-gas. As much as 30 percent of natural gas in the world is significantly contaminated by hydrogen sulfide. Hydrogen sulfide is poisonous to employees and explodes easily, making it extremely dangerous on oil and gas drilling and production sites. Some companies vent or burn off the $H_2S$ containing associated gas, however, its combustion produces another dangerous gas: sulfur dioxide ($SO_2$), when combined with atmospheric humidity, turns into acid rain. Burning or venting of $H_2S$ containing associated gas (very potent greenhouse gas due to high methane content) takes place due in large part to the inability of existing technologies to process the gas for transmission into the natural gas supply system (<2 ppm $H_2S$ content is a requirement for pipelines).

One of the promising approaches to $H_2S$ handling is its plasma dissociation that was initially proposed in 1980-s and is still not commercialized. Due to high corrosion rates of metals in $H_2S$ at high temperatures, from the beginning, the plasma-chemical process development was focused on electrodeless plasma systems such as microwave (MW) and Radio-Frequency Inductively Coupled Plasma (RF ICP). In the recent research papers, the authors reported use of plasma systems with direct contact between electrodes and hydrogen sulfide (e.g. Nunnally, T., Gutsol, K., Rabinovich, A., Fridman, A., Starikovsky, A., Gutsol, A., Potter, R. W., "Dissociation of $H_2S$ in non-equilibrium gliding arc "tornado" discharge", International Journal of Hydrogen Energy 34 (2009); Gutsol, K., Nunnally, T., Rabinovich, A., Fridman, A., Starikovsky, A., Gutsol, A., Kemoun, A., "Plasma assisted dissociation of hydrogen sulfide" Int. J. Hydrogen Energy 37 (2012) pp. 1335-1347; Nunnally, T., Gutsol, K., Rabinovich, A., Fridman, A., Gutsol, A., "Plasma dissociation of $H_2S$ with $O_2$ addition", Int. J. Hydrogen Energy 39 (2014) pp. 12480-12489); Gutsol, K., Robinson, R., Rabinovich, A., Gutsol, A., and Fridman, A., "High conversion of hydrogen sulfide in gliding arc plasmatron", Int. J. Hydrogen Energy, 42 (2017) pp. 68-75.), however the power of the systems (and therefore the discharge currents) were very small and the authors did not discuss the issue of stability of the electrodes.

Despite recent progress in the development of industrial continuous wave (CW) MicroWave (MW) technology (first of all for food heating and defrosting), MW plasma systems of atmospheric pressure have usually very low power for potential industrial $H_2S$ dissociation. The same is true for Radio Frequency Inductive Coupled Plasma (RF ICP) systems. On the other hand, arc discharge systems are available in a very wide range of powers and can easily reach the megawatt range.

Description of the Related Art

There are several known approaches to handle corrosive substances by arc plasma generators (plasmatrons). First, it is possible to inject the reagents into jets of plasma that can be generated by any type of electric discharge. This approach has two significant disadvantages: products become dissolved with the plasma gas and this requires gas separation from the products and the process requires higher Energy Cost or Specific Energy Requirement, SER (SER=number of kWh of electric energy required for dissociation of 1 $m^3$ of $H_2S$) because a portion of energy will stay with the plasma gas. Another approach uses a shielding gas, when cathode, for example, is covered with a flow of inert gas, and the reacting gas is injected downflow. This approach has the same disadvantages though less pronounced because consumption of the shielding gas is usually much smaller than that of the reacting gas. An additional disadvantage of this approach is a complication of the plasma generator design and operation.

Thus, there is a need in the art for development of electric arc-based technology for hydrogen sulfide dissociation. The goal of this invention is to find material(s) and conditions that will allow using arc discharge for hydrogen sulfide dissociation.

SUMMARY OF THE INVENTION

In one embodiment, it is possible to use tungsten or molybdenum as cathode materials and stainless steel for anodes of the arc plasma-chemical reactors for hydrogen sulfide dissociation.

A device for hydrogen sulfide plasma dissociation includes a plasma chemical reactor including an arc plasma generator that has a cathode and an anode; the anode having a working surface for contacting hydrogen sulfide plasma, wherein the working surface is made from a material that includes stainless steel, tungsten or molybdenum; the cathode having a tip for arc attachment where a cathode spot is formed, wherein the cathode tip is made from pure tungsten, pure molybdenum, a tungsten or molybdenum alloy with tungsten or molybdenum as a major component or a composite material in which tungsten or molybdenum is the major component; and a flow path configured to have an inlet for gaseous hydrogen sulfide for dissociation in plasma into hydrogen and sulfur, and an outlet for gaseous products of hydrogen sulfide plasma dissociation.

Optionally, the alloy of the cathode has up to 10% of low work function elements (such as thorium, cerium, lanthanum, or zirconium). Optionally, the composite material of the cathode has up to 10% thorium or lanthanum. Optionally, all surfaces of the arc plasma generator that are in contact with the hydrogen sulfide are kept at temperatures above a temperature of sulfur condensation. Optionally, all surfaces of the arc plasma generator that are in contact with the hydrogen sulfide are made from 316 stainless steel, pure tungsten, pure molybdenum, a tungsten or molybdenum alloy with tungsten or molybdenum as a major component or a composite material in which tungsten or molybdenum is the major component.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENTS

Reference will now be made in detail to the embodiments of the present invention, examples of which are illustrated in the accompanying drawings.

It is known that all metals except gold form sulfides. Also, it is known that during plasma dissociation of $H_2S$, in addition to sulfur molecules $S_n$, where n≥2, in the gas phase, very reactive radicals S and SH form. It is also known that sulfur is the closest element to oxygen regarding their chemical properties as oxidizers. Therefore, it was expected that metals that are not stable in oxygen, are not stable is sulfur atmosphere also.

Figure 1:
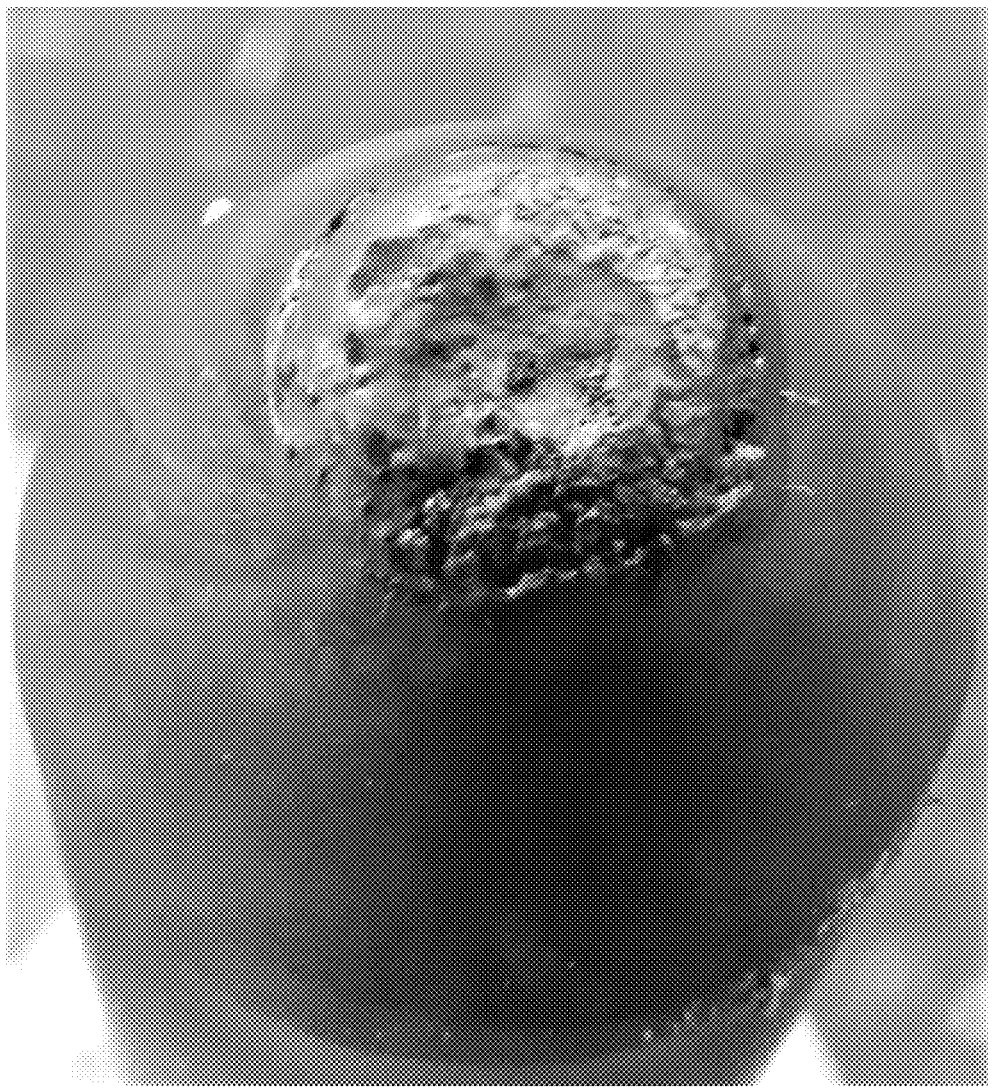
FIG. 1 shows a hafnium tip of a cathode after 10 minutes of operation in $H_2S$ at 2 A current.

In plasma arc devices that are working with oxygen-containing gases (oxygen, air, water vapor), hafnium or zirconium cathodes (so-called thermochemical cathodes) demonstrate very good and stable properties because of formation of very thermally stable electrically conductive films of their oxides or nitrides on the surface of the melted metal crater. There was a small hope that as hafnium electrodes can work with water vapor, they may also work with hydrogen sulfide. The experiment showed rather fast destruction of hafnium insert in the condition of low-current arc in $H_2S$ (FIG. 1). It is possible to see that a protective oxide/nitride film on a crater is destroyed, and surface is irregular, probably because of local bubbling out of dissolved gases (Hafnium melting temperature is 2506 K and boiling temperature is 4876 K).

Another small hope was that a tungsten cathode can survive in a hydrogen sulfide atmosphere. This hope was supported by the data that tungsten is one of the most stable metals with regard to high-temperature $H_2S$ corrosion (Farber, M. and Ehrenberg, D. M., 1952. High-Temperature Corrosion Rates of Several Metals with Hydrogen Sulfide and Sulfur Dioxide. *Journal of The Electrochemical Society*, 99(10), pp. 427-434). However, the studied data were obtained at temperatures of about 1200 K while the cathode spot temperature is usually much higher. Thus, it is known that the arc cathode spots have radii of 0.5-2 mm and emit electrons due to the thermionic emission and, therefore, the spot surface temperature is about 3000-4000 K (Jiittner, B., 1997, Properties of arc cathode spots. *Le Journal de Physique IV*, 7(C4), pp. C4-31).

Figure 2:
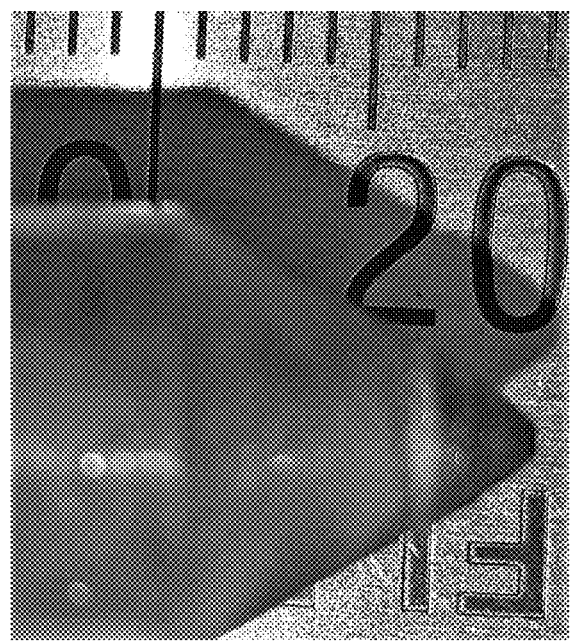
FIG. 2 shows a cathode with tungsten tip after 30 minutes of operation in hydrogen at 2 A current.
Figure 3:
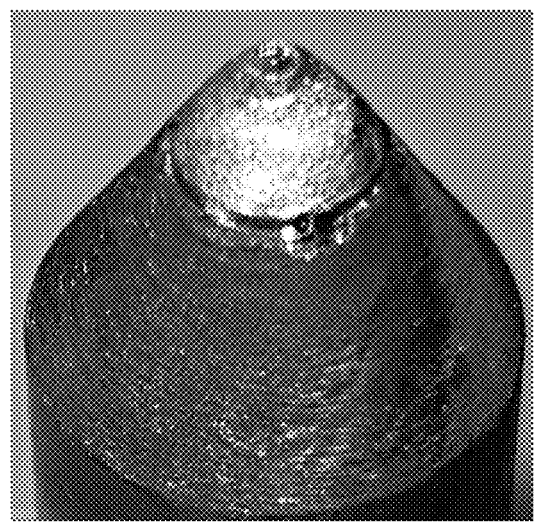
FIG. 3 shows the same cathode with tungsten tip after 30 minutes of operation in $H_2S$ at 2 A current.

Experiments demonstrated a surprising result (FIGS. 2 and 3, showing a roughly 10 mm cathode, with a roughly 4.5 mm tip (at max diameter), in that example—generally, the tip can be as small as 1 mm, and as large as 10 mm, for large cathodes). Initially, the tungsten cathode was tested in hydrogen that is known to be safe for tungsten.

It is possible to see (FIG. 2) that after the sharp cathode tip became dull, there was no further substantial erosion, though the tungsten became darker than its stainless-steel holder.

When the same electrode was used for 30 minutes in $H_2S$, no further erosion became visible, but tungsten became shiny metal-white while the stainless-steel holder became dark (FIG. 3).

Figure 4:
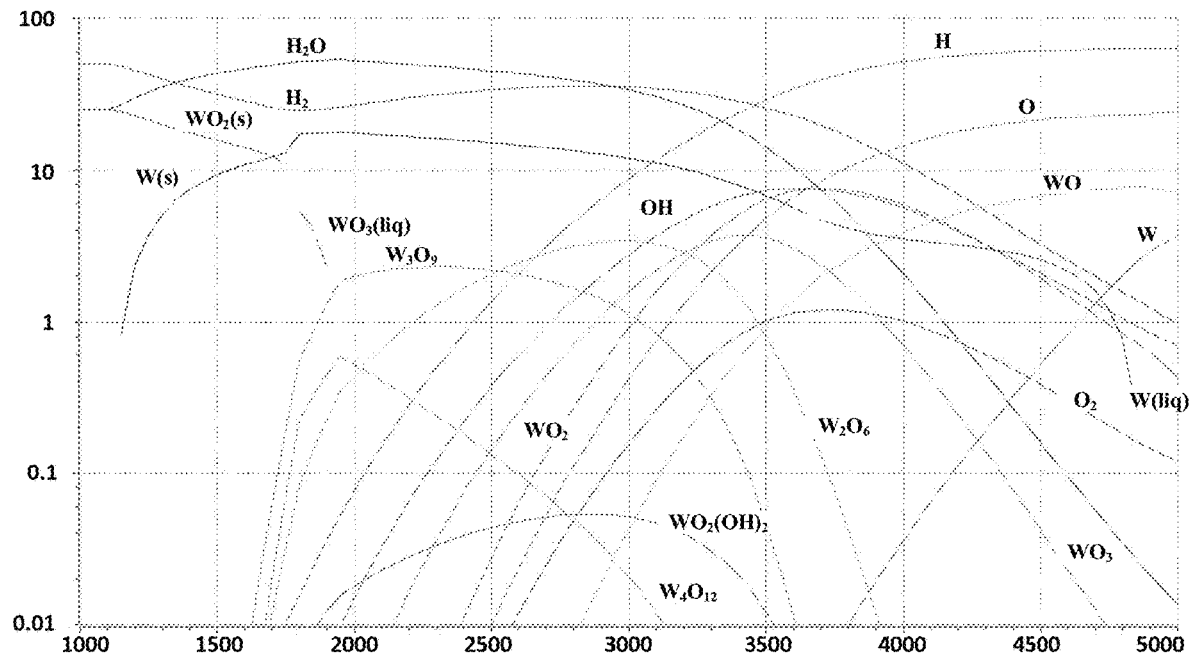
FIG. 4 shows equilibrium fractions (% mol.) of substances formed from $W+3H_2O$.

To understand why tungsten is stable with $H_2S$ arc and not stable with $H_2O$ arc, thermodynamic equilibrium simulation was made of two mixtures: $W+3H_2O$ (FIG. 4) and $W+2H_2S$ (FIG. 5).

It is possible to see that there are fundamental differences in these two equilibrium mixtures. At low temperatures, solid tungsten is not a major component and should be converted to $WS_2$(solid) or $WO_2$(solid), but reactions are slow at these temperatures and the conversion will take a lot of time. At high temperatures above 2000 K, solid and then liquid tungsten is the only substantial W-containing substance in $H_2S$ atmosphere (FIG. 5). On the other hand, at these high temperatures in $H_2O$ atmosphere (FIG. 4), many gaseous W-containing substances ($W_3O_9$, $W_2O_6$, $WO_3$, $WO_2$, and WO) are thermodynamically stable in high concentrations and this should result in the fast chemical erosion of a tungsten electrode.

Figure 5:
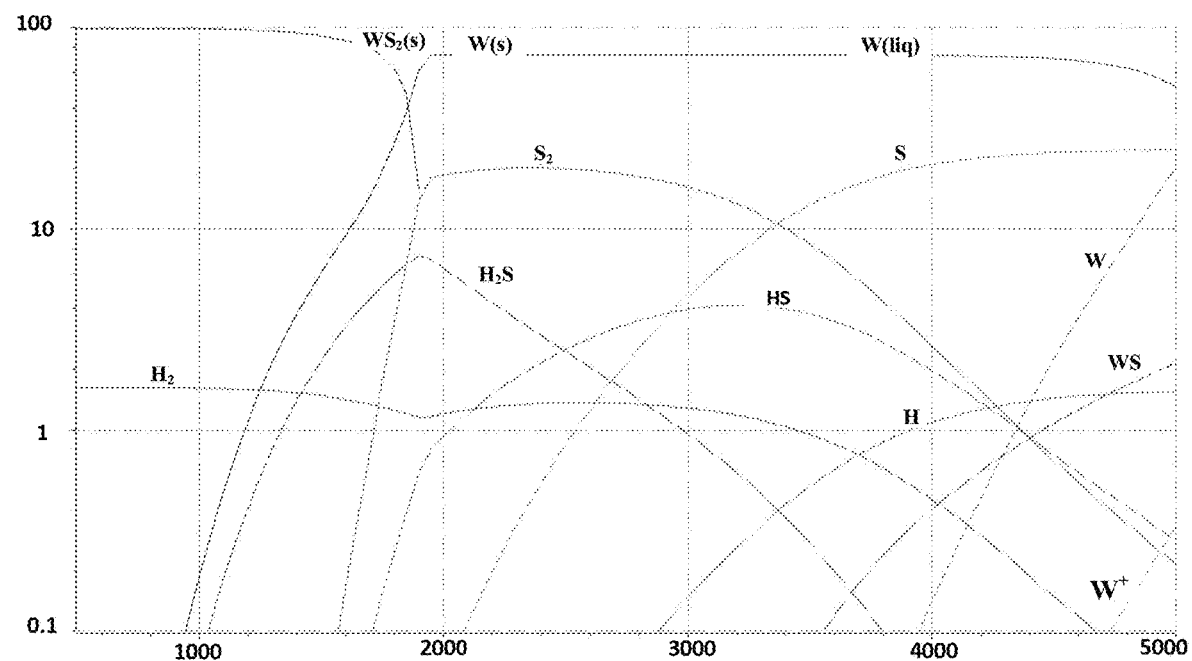
FIG. 5 shows equilibrium (% mass) of substances formed from $W+2H_2S$.
Figure 6:
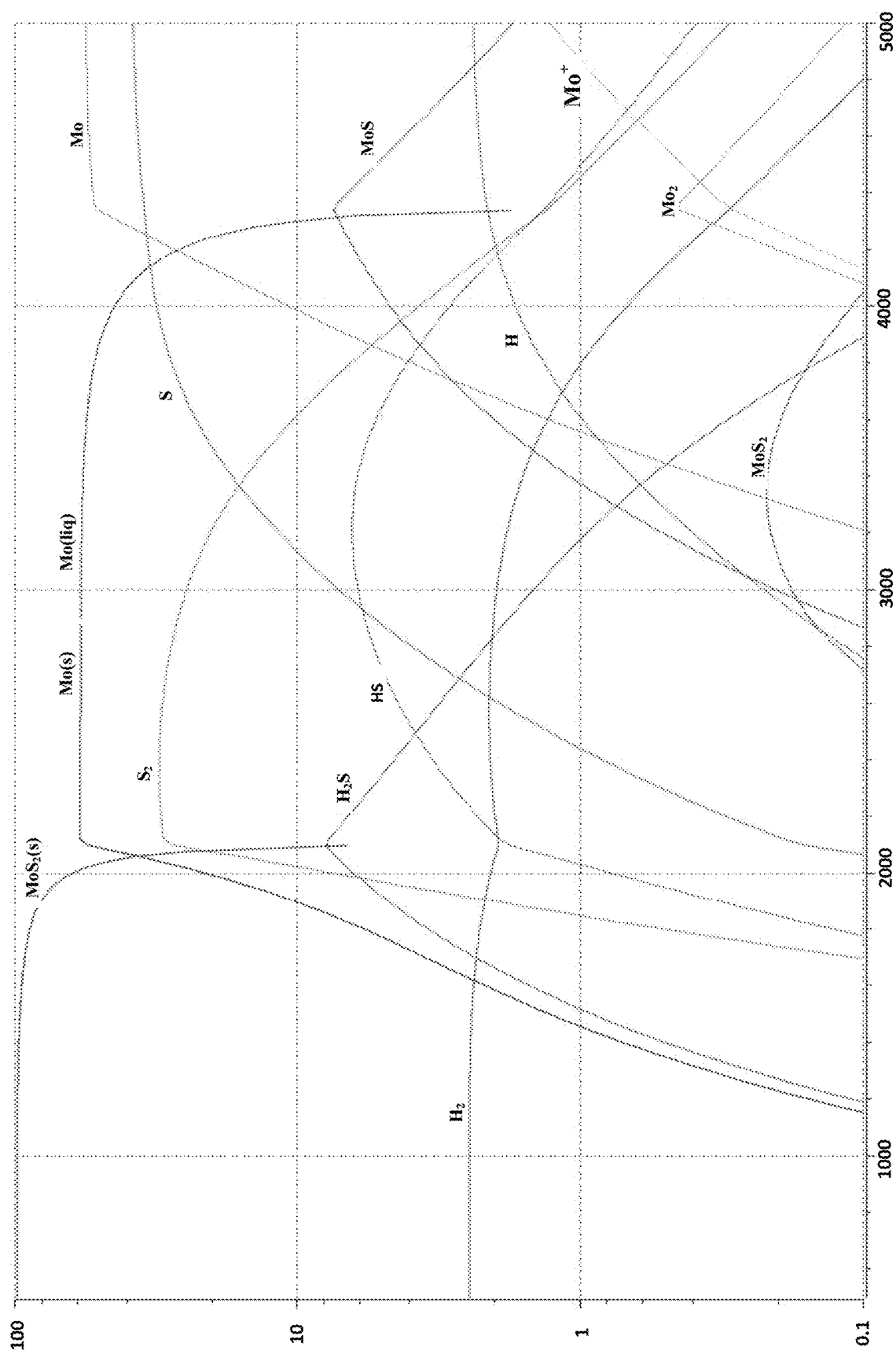
FIG. 6 shows equilibrium fractions (% mass) of substances formed from $Mo+2H_2S$.

FIG. 5 shows equilibrium fractions (% mass) of substances formed from $W+2H_2S$. FIG. 6 shows equilibrium fractions (% mass) of substances formed from $Mo+2H_2S$.

Thermodynamic simulation is a good tool to understand the major chemical stability and instability issues, however, it cannot take into account kinetics of the spatially non-uniform electrochemical processes in the cathode vicinity. Because of the thermionic emission, the concentration of electrons near the cathode tip is much higher than that of positive ions. FIG. 5 shows some concentration of $W^+$ that is equal to that of electrons at very high temperatures. In the vicinity of the cathode spot, the concentration of electrons will be much higher and they will effectively ionize gaseous tungsten because it has the lowest ionization potential among all substances in the mixture. Then positively charged tungsten ions $W^+$ will be attracted by strong electric field back to the cathode, and thus it will be effective vapor deposition of tungsten on the cathode surface. This is probably the reason why the tungsten cathode became shiny white after the operation in $H_2S$ atmosphere.

It is known that molybdenum (Mo) is chemically very similar to tungsten. Thermodynamic equilibrium simulation of the mixture $Mo+2H_2S$ (FIG. 6) shows that this similarity will allow probably to use molybdenum cathodes for $H_2S$ plasma generation, however lower melting temperature and higher vapor pressure of molybdenum in comparison with tungsten make tungsten the first choice for manufacturing of arc cathodes. The cathode is typically made of 316 stainless steel, while the cathode tip can be made from pure tungsten, a tungsten alloy (at least 90% tungsten, the rest low work function elements, such as thorium, cerium, lanthanum, or zirconium), pure molybdenum, or an alloy of molybdenum (at least 90% molybdenum, the rest low work function elements), or a composite, such as made from powdered metals, where at least 90% are tungsten grains, the rest low work function elements or their compounds grains, or a composite in which where at least 90% are molybdenum grains, the rest low work function elements or their compounds grains.

An anode made from stainless steel (SS 316) also demonstrated very good stability at least at low currents, and this is not surprising because it is known that SS316 is stable in $H_2S$ atmosphere, and fast motion of the anode spot that can be arranged by different known ways, e.g., by gas-dynamic or magnetic rotation, can prevent overheating of the metal in the anode spot. Other anode materials can be used also, for example, it is a known practice to make anodes from the tungsten-containing composite materials. Probably, the use of copper as a standard material for arc anodes is not a good choice because of the known high rate of copper corrosion in hydrogen sulfide.

Figure 7:
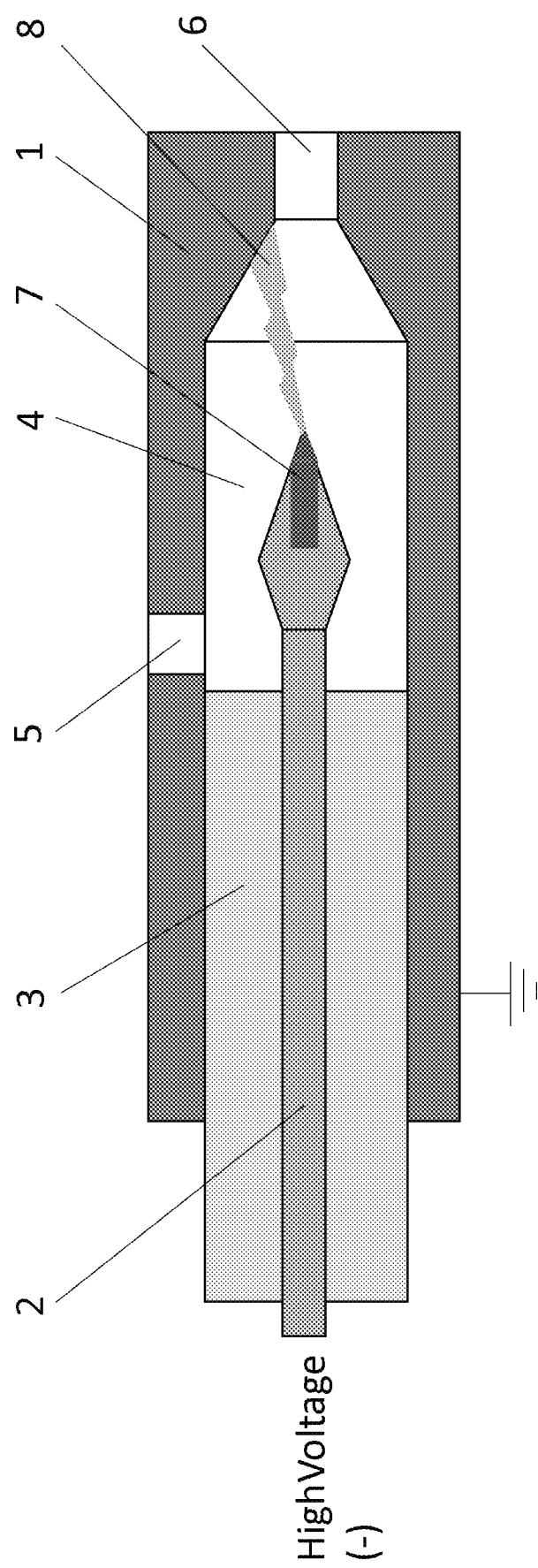
FIG. 7 shows a schematic of a high-voltage axial plasmatron for dissociation of hydrogen sulfide.

FIG. 7 shows a schematic of a high-voltage axial plasmatron for dissociation of hydrogen sulfide, according to one embodiment of the invention. In the figure: (1)—grounded anode; (2)—high-voltage cathode; (3)—insulator; (4)—plasma-chemical reactor chamber; (5)—plasma gas (hydrogen sulfide) inlet; (6)—outlet for gaseous products; (7)—cathode tip; (8)—electric arc discharge.

Thus, it is possible to make $H_2S$ dissociation in an arc plasma generator (plasmatron).

Having thus described a preferred embodiment, it should be apparent to those skilled in the art that certain advantages of the described method and apparatus have been achieved.

It should also be appreciated that various modifications, adaptations and alternative embodiments thereof may be made within the scope and spirit of the present invention. The invention is further defined by the following claims.

What is claimed is:

1. A device for hydrogen sulfide plasma dissociation, comprising:
   a plasma chemical reactor including an arc plasma generator that has a cathode and an anode;
   the anode having a working surface for contacting hydrogen sulfide plasma, wherein the working surface is made from a material that includes stainless steel, tungsten or molybdenum;
   the cathode having a tip for arc attachment where a cathode spot is formed, wherein the cathode tip is made from pure tungsten, pure molybdenum, a tungsten or molybdenum alloy with tungsten or molybdenum as a major component or a composite material in which tungsten or molybdenum is the major component; and
   a flow path configured to have an inlet in a proximal portion of the device for gaseous hydrogen sulfide for dissociation in plasma into hydrogen and sulfur, and an outlet in a distal portion of the device, for products of hydrogen sulfide plasma dissociation;
   the cathode having a tip holder extending proximally of the tip, wherein the tip holder first widens, and then narrows,
   wherein the working surface of the anode encloses the cathode and extends proximally at least as far as the narrowing part of the tip holder,
   wherein the proximal portion is made from the same material as the tip; and
   an electrically conductive channel between the cathode and the anode, wherein the channel is formed by hydrogen sulfide plasma.

2. The device of claim 1, wherein the alloy of the cathode has up to 10% of low work function elements.

3. The device of claim 2, wherein the low work function elements are any of thorium, cerium, lanthanum, and zirconium.

4. The device of claim 1, wherein the composite material of the cathode has up to 10% of low work function elements or their compounds.

5. The device of claim 4, wherein the low work function elements are any of thorium, cerium, lanthanum, and zirconium.

6. The device of claim 1, wherein all surfaces of the arc plasma generator that are in contact with the hydrogen sulfide are kept at temperatures above a temperature of sulfur condensation.

7. The device of claim 1, wherein all conductive surfaces of the arc plasma generator that are in contact with the hydrogen sulfide are made from 316 stainless steel, pure tungsten, pure molybdenum, a tungsten or molybdenum alloy with tungsten or molybdenum as a major component, or a composite material in which tungsten or molybdenum is the major component.

8. The device of claim 1, wherein the outlet provides liquid products of the hydrogen sulfide plasma dissociation.

9. The device of claim 1, wherein the outlet provides gaseous products of the hydrogen sulfide plasma dissociation.

10. A device for hydrogen sulfide plasma dissociation, comprising:
    a plasma chemical reactor including an arc plasma generator that has a cathode and an anode;
    the anode made from a material that includes stainless steel, tungsten or molybdenum;
    the cathode having a tip for arc attachment where a cathode spot is formed, wherein the tip is made from pure tungsten, pure molybdenum, or a tungsten or molybdenum alloy;
    a flow path configured to have an inlet for gaseous hydrogen sulfide, and an outlet for products of hydrogen sulfide plasma dissociation; and
    an electrically conductive channel between the cathode and the anode, wherein the channel is formed by hydrogen sulfide plasma,
    wherein the products of the hydrogen sulfide plasma dissociation include liquid and gaseous sulfur,
    wherein the inlet is located in a proximal portion of the device, and the outlet is located in a distal portion of the device;
    wherein the cathode has a tip holder extending proximally of the tip, wherein the tip holder first widens, and then narrows, and
    wherein the working surface of the anode encloses the cathode and extends proximally at least as far as the narrowing part of the tip holder.

11. The device of claim 10, wherein the proximal portion is made from the same material as the tip.

* * * * *